United States Patent [19]
Takada et al.

[11] Patent Number: 6,011,444
[45] Date of Patent: Jan. 4, 2000

[54] VOLTAGE CONTROLLED OSCILLATOR CIRCUIT

[75] Inventors: Shuichi Takada, Kawasaki; Akihiko Yoshizawa, Yokohama, both of Japan

[73] Assignee: Kabushiki Kaisha Toshiba, Kawasaki, Japan

[21] Appl. No.: 09/132,196

[22] Filed: Aug. 11, 1998

[30] Foreign Application Priority Data

Aug. 14, 1997 [JP] Japan ..................................... 9-219442

[51] Int. Cl.[7] ................................. H03B 5/24; H03L 7/06
[52] U.S. Cl. ................................... 331/57; 331/2; 331/17; 331/34; 331/177 R; 331/186
[58] Field of Search .................................. 331/2, 17, 34, 331/57, 175, 177 R, 185, 186; 327/156–159

[56] References Cited

U.S. PATENT DOCUMENTS 5,847,616 12/1998 Ng et al. ..................................... 331/57

Primary Examiner—David Mis
Attorney, Agent, or Firm—Oblon, Spivak, McClelland, Maier & Neustadt, P.C.

[57] ABSTRACT

An object is to keep the oscillation gain nearly constant and attain an oscillation frequency with high stability and low jitter. A voltage controlled oscillator circuit (VCO) is constructed by a VCO control circuit and a ring oscillator. The VCO control circuit has two input terminals (n input, w input). The VC control circuit multiplies the n input by the w input, and outputs a control signal (PMOS n input, NMOS n input) obtained by adding the result of multiplication to the n input. The ring oscillator is constructed by delay circuits of an odd number of stages serially connected.

20 Claims, 8 Drawing Sheets

VOLTAGE CONTROLLED OSCILLATOR CIRCUIT

BACKGROUND OF THE INVENTION

This invention relates to a voltage controlled oscillator circuit and more particularly to a voltage controlled oscillator circuit for generating a frequency in a stable oscillation range even when a process fluctuation, or a variation in the temperature or power supply voltage occurs.

FIG. 1 shows a conventional voltage controlled oscillator circuit.

The voltage controlled oscillator circuit (VCO) includes a plurality (an odd number) of serially connected delay circuits 1-1, 1-2, . . . , 1-n. An output of the final stage delay circuit 1-n among the plurality of delay circuits 1-1, 1-2, . . . , 1-n is fed back to the first stage delay circuit 1-1 to construct a ring oscillator.

Each of the delay circuits 1-1, 1-2, . . . , 1-n includes p-channel MOS transistors Tr3, Tr4 serially connected between a power supply VDD and an output terminal, and n-channel MOS transistors Tr5, Tr6 serially connected between the output terminal and a ground node GND. The gates of the transistors Tr4, Tr5 of each of the delay circuits are supplied with an output of the preceding stage delay circuit, but the gates of the transistors Tr4, Tr5 of the first stage delay circuit 1-1 are supplied with an output of the final stage delay circuit 1-n.

The gate of the transistor Tr3 on the power supply VDD side is applied with a control voltage VPC and the gate of the transistor Tr6 on the ground node GND side is applied with a control voltage VNC. The control voltage VPC is output from the drain of a p-channel MOS transistor Tr1 having a source connected to the power supply VDD and a gate and drain connected to each other. The control voltage VNC is also applied to the gate of an n-channel MOS transistor Tr2. The source of the transistor Tr2 is connected to the ground node GND and the drain thereof is connected to the drain of the transistor Tr1.

The oscillation frequency f of the voltage controlled oscillator circuit with the above construction can be expressed as follows if the delay time of one delay circuit is set to t and the number of stages of the delay circuits is set to n.

$$f=1/(2 \times t \times n)$$

The delay time of the delay circuit is determined by the control voltages VPC, VNC. That is, the amounts of currents flowing in the transistors Tr3, Tr6 are changed by the control voltages VPC, VNC so as to adjust time required for an inverter constructed by the transistors Tr4, Tr5 to charge or discharge the input capacitor of the next stage delay circuit.

Thus an electric current I flowing through a series circuit of the MOS transistors Tr1 and Tr2 and amount of electric current flowing through the MOS transistors Tr3 and Tr6 have a proportional relation and, therefore, the delay time of the delay circuit is controlled proportional to the electric current I.

The conductances of the transistors Tr1, Tr2 are determined by the control voltage VNC, the control voltage VPC is generated according to the conductances of the transistors Tr1, Tr2 and the control voltage VPC varies complementarily with respect to the control voltage VNC. For example, when the control voltage VNC becomes higher, the control voltage VPC becomes lower.

FIG. 2 shows the relation between the control voltage VNC of the voltage controlled oscillator circuit of FIG. 1 and the oscillation frequency thereof, that is, the oscillation frequency characteristic. The oscillation frequency of the voltage controlled oscillator circuit is changed according to the control voltage VNC. However, if the process fluctuation or a variation in the temperature or power supply voltage occurs, the oscillation frequency is significantly changed. Therefore, it becomes necessary to increase a margin of the oscillation gain (the variation width of the oscillation frequency/the variation width of the control voltage) of the voltage controlled oscillator circuit in order to permit the oscillation frequency range of the voltage controlled oscillator circuit to satisfy the specification under any circumstances. Further, in order to suppress a jitter (fluctuation of the oscillation frequency) of the voltage controlled oscillator circuit, it is necessary to lower the oscillation gain of the voltage controlled oscillator circuit. This is because the oscillation frequency is largely changed by noises or fluctuation of the control voltage if the oscillation gain of the voltage controlled oscillator circuit is large.

However, an oscillation gain of a wide range is required to attain a wide application range and a lowering of the oscillation gain indicates that the wide application is limited. For this reason, it is necessary to lower the oscillation gain of the normal voltage controlled oscillator circuit to the minimum permissible value while the oscillation gain for the application range is acquired.

However, the actual voltage controlled oscillator circuit is constructed to permit the oscillation frequency range to satisfy the specification under any circumstances by taking the process fluctuation or a variation in the temperature or power supply voltage into consideration. Therefore, for example, when the voltage controlled oscillator circuit is incorporated into a PLL circuit (Phase Locked Loop Circuit), the jitter characteristic will largely be influenced by the process fluctuation or a variation in the temperature or power supply voltage.

BRIEF SUMMARY OF THE INVENTION

This invention has been made to solve the above problem and an object of this invention is to provide a voltage controlled oscillator circuit capable of keeping the oscillation gain almost constant irrespective of the process fluctuation or a variation in the temperature or power supply voltage and generating an oscillation frequency with low jitter and high stability when it is incorporated into a PLL circuit.

In order to attain the above object, a voltage controlled oscillator circuit (corresponding to 14 in FIG. 3) of this invention comprises a control circuit (2 in FIG. 8) for receiving first and second control signals (n input, w input), multiplying the first control signal by the second control signal, adding the result of multiplication to the first control signal and outputting a plurality of third control signals; and a generation circuit (1-1, . . . , 1-n) for generating the oscillation signal having a frequency based on the plurality of third control signals output from the control circuit (refer to FIG. 8).

The first control signal controls the output frequency of the voltage controlled oscillator circuit to a desired value, and the second control signal is an output signal of an oscillation gain control circuit (10 in FIG. 3) and controls the gain characteristic of the output frequency of the voltage controlled oscillator circuit.

The oscillation gain control circuit includes a PLL circuit having a voltage controlled oscillator circuit (11 of FIG. 3) which has the same oscillation characteristic as that of the above voltage controlled oscillator circuit and a control signal used for controlling the voltage controlled oscillator circuit of the PLL circuit is output as the second control signal.

The generation circuit includes a ring oscillator having delay circuits of an odd number of stages.

The control circuit comprises a first MOS transistor (Tr16) connected at its source connected to a first power source (GND), second and third MOS transistors (Tr14 and Tr15) series-connected between the drain of the first MOS transistor and the first power source (GND), a fourth MOS transistor (Tr12) connected at its source to a second power source (VDD) and has their gate and drain connected to each other, a fifth MOS transistor (Tr17) connected at its source to the second power source (VDD) and at its gate to the drain of the fourth MOS transistor, a sixth MOS transistor (Tr18) connected at its source to the first power source and at its gate and drain to the drain of the fifth MOS transistor, a seventh transistor (Tr13) connected between the drain of the first MOS transistor and the drain of the fourth MOS transistor, a first adjusting circuit (Tr11) for receiving a potential on a junction point between the first and seventh MOS transistors and adjusting a potential on the gate of the seventh MOS transistor so as to maintain a potential on that junction point constant, a ninth MOS transistor (Tr22) connected at its source to the first power source, a tenth MOS transistor (Tr20) connected at its source to the second power source and having its gate and drain connected to each other, an eleventh MOS transistor (Tr23) connected at its source to the second power source and at its gate to the drain of the tenth MOS transistor, a twelfth MOS transistor (Tr24) connected at its source to the first power source and at its gate and drain to the drain of the eleventh transistor, a thirteenth MOS transistor (Tr21) connected between the drain of the ninth MOS transistor and the drain of the tenth MOS transistor and a second adjusting circuit (Tr19) for receiving a potential on a junction point between the ninth and thirteenth MOS transistors and adjusting a potential on the gate of the thirteenth MOS transistor (See FIG. 9).

The first adjusting circuit comprises an eighth MOS transistor connected at its source to the first power source and a constant current circuit, and the drain of the eighth MOS transistor is connected to the gate of the seventh MOS transistor. Similarly, the second adjusting circuit comprises a fourteenth MOS transistor connected at its source to the first power source and a constant current circuit, and the fourteenth MOS transistor is connected at its drain to the gate of the thirteenth transistor.

The first control signal is input to the gates of the first and second transistors and the second control signal is input to the gates of the third and ninth MOS transistors and the third control signals are obtained from the drain of the fourth and sixth MOS transistors.

The first adjusting circuit includes an eighth MOS transistor having a source connected to the first power supply and a constant current source circuit connected between the drain of the eighth MOS transistor (Tr11) and the second power supply, the potential at the connection node is input to the gate of the eighth MOS transistor and the drain of the eighth MOS transistor is connected to the gate of the seventh MOS transistor.

In another aspect of the present invention, a voltage controlled oscillator circuit (corres. to 14 in FIG. 3) comprises a first control circuit (a section (a) in FIG. 9) for receiving first and second control signals, adding a multiplication result of first and second control signals and the first control signal to obtain an added signal and outputting a plurality of third control signals based on the added signal, a second control circuit (a section (b) in FIG. 9) for receiving the second control signal and outputting a plurality of fourth control signals on the basis of the second control signal, and circuit (I-1, . . . , I-n in FIG. 8) for adding the third and fourth control signals and producing a signal of a predetermined frequency on the basis of a result. The circuit above provides a ring oscillator comprised of an odd number of delay circuits. The delay circuit comprises a thirty-first MOS transistor (Tr4) connected at its source to a first power supply, a thirty-second MOS transistor (Tr6) connected at its source to the first power supply and its drain connected to the drain of the thirty-first MOS transistor, a thirty-third MOS transistor (Tr1) connected at its source to a second power supply, a thirty-fourth MOS transistor (Tr5) connected at its source to a second power supply and at its drain to a drain of the thirty-third MOS transistor (Tr1) and thirty-fifth and thirty-sixth MOS transistors (Tr3, Tr2) series-connected between the drain of the thirty-first MOS transistor and that of the thirty-third MOS transistor and the third control signals are input to the gates of the thirty-first and thirty-third MOS transistors and the fourth control signals are input to the thirty-second and thirty-fourth MOS transistors.

The first control circuit comprises the first to seventh MOS transistors (Tr16, Tr14, Tr15, Tr12, Tr17, Tr18, Tr13) and the first adjusting circuit (Tr11), and the second control circuit comprises the ninth to thirteenth MOS transistors (Tr22, Tr20, Tr23, Tr24, Tr21) and the second adjusting circuit (Tr19). The fourth control signals are obtained from the drain of the tenth and twelfth MOS transistors.

Thus, this invention includes the oscillation gain control circuit having the PLL circuit including a reference voltage controlled oscillator circuit and the to-be-controlled voltage controlled oscillator circuit. The oscillation gain control circuit having the PLL circuit receives a reference frequency and effects the control operation to keep the oscillation gain and oscillation frequency of the reference voltage controlled oscillator circuit within a predetermined range.

The control operation is effected to cancel the variation in the oscillation gain of the reference voltage controlled oscillator circuit by increasing the oscillation gain and oscillation frequency if the oscillation frequency of the reference voltage controlled oscillator circuit in the oscillation gain control circuit is lowered due to the process fluctuation or a variation in the temperature or power supply voltage, and lowering the oscillation gain and oscillation frequency if the oscillation frequency of the reference voltage controlled oscillator circuit in the oscillation gain control circuit is increased.

Since the to-be-controlled voltage controlled oscillator circuit which has the same construction as the reference voltage controlled oscillator circuit is controlled by the oscillation gain control circuit which is controlled with high precision, the free run frequency and oscillation gain of the to-be-controlled voltage controlled oscillator circuit can be made nearly constant irrespective of the process fluctuation or a variation in the temperature or power supply voltage.

Therefore, the PLL circuit including the voltage controlled oscillator circuit used as a to-be-controlled object can output a frequency with low jitter and high stability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

There will now be described a voltage controlled oscillator circuit of this invention in detail with reference to the accompanying drawings.

Figure 1:
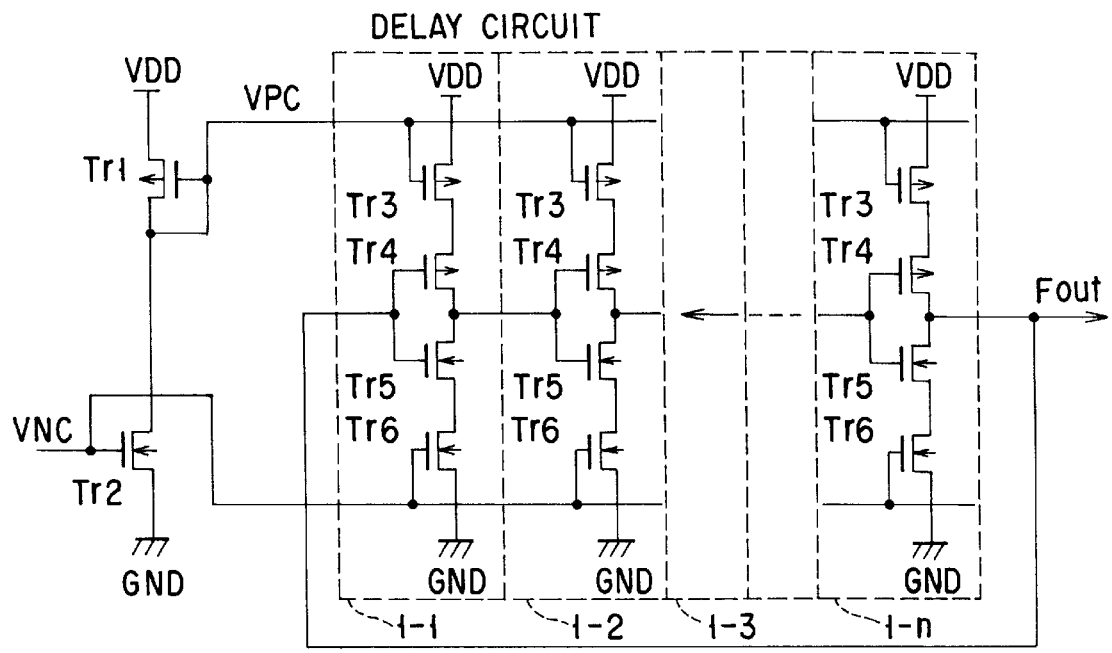
FIG. 1 is a circuit diagram showing a conventional voltage controlled oscillator circuit.
Figure 2:
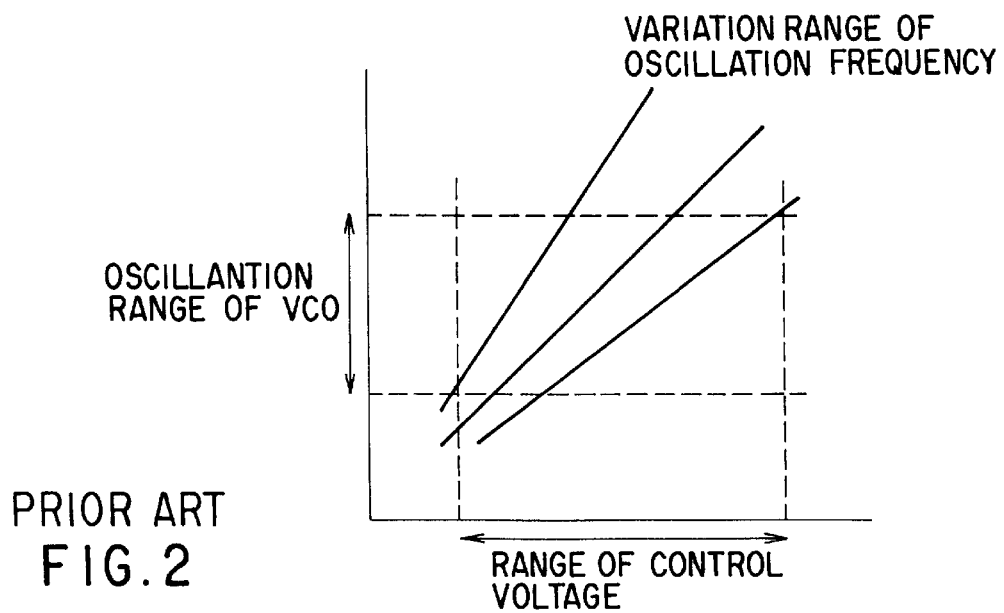
FIG. 2 is a diagram showing the oscillation frequency characteristic of the conventional voltage controlled oscillator circuit.
Figure 3:
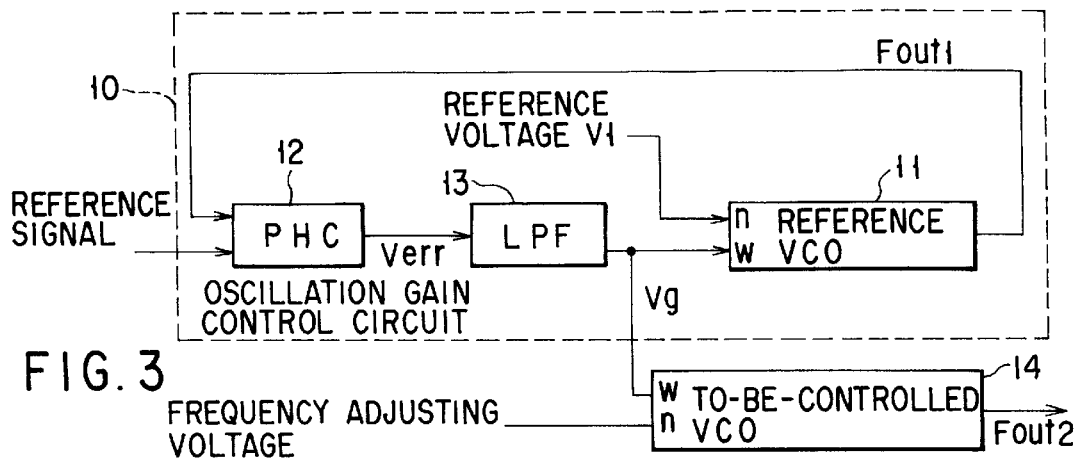
FIG. 3 is a circuit diagram showing a voltage controlled oscillator circuit according to one embodiment of this invention.

FIG. 3 shows a voltage controlled oscillator circuit according to one embodiment of this invention.

A reference voltage controlled oscillator circuit (which is hereinafter referred to as a reference VCO) 11 in an oscillation gain control circuit 10 includes a ring oscillator having delay circuits of an odd number of stages and has two-series control input terminals n and w. One (w input) of the two control input terminals has a large control coefficient for the voltage controlled oscillator circuit and can control the oscillation frequency in a wide range. The other control input terminal (n input) has a small control coefficient for the voltage controlled oscillator circuit and can control the oscillation frequency in a narrow range.

A phase comparator (PHC) 12 is supplied with a reference signal and an output frequency Fout1 of the reference VCO 11. The phase comparator 12 compares the phases of the two input signals during the rise time and outputs an error signal Verr for a period of time corresponding to the phase difference. A low-pass filter (LPF) 13 is supplied with the error signal Verr and outputs a DC component Vg of the error signal Verr.

In the reference VCO 11, the oscillation frequency is controlled in a narrow range by use of a control voltage obtained by adding a reference voltage V1 input to the input terminal n of the small control coefficient to the result of multiplication of the reference voltage V1 input to the input terminal n of the small control coefficient by the voltage Vg input to the input terminal w of the large control coefficient, and the oscillation frequency is controlled in a wide range by use of the voltage Vg input to the input terminal w of the large control coefficient.

The DC component Vg of the oscillation gain control circuit 10 is input to the input terminal w of the large control coefficient of a to-be-controlled voltage controlled oscillator circuit (which is hereinafter referred to as a to-be-controlled VCO) 14. By constructing the reference VCO 11 and to-be-controlled VCO 14 to have the same circuit construction, the free run frequency and oscillation gain of the to-be-controlled VCO 14 become equal to those of the reference VCO 11.

Therefore, when a voltage input to the input terminal n of the small control coefficient of the to-be-controlled VCO 14 is equal to a voltage input to the input terminal n of the small control coefficient of the reference VCO 11, the oscillation frequency Fout2 coincides with the frequency of the reference signal.

The feature of this invention is that when the oscillation frequency of the reference VCO 11 is lowered due to the process fluctuation or a variation in the temperature or power supply voltage, the DC component Vg is increased so as to set the oscillation frequency equal to the frequency of the reference signal and the oscillation frequency and oscillation gain are increased. Further, when the oscillation frequency of the reference VCO 11 is increased, the DC component Vg is lowered to lower the oscillation frequency and oscillation gain, and thus the DC component Vg acting to cancel the variation in the oscillation gain of the reference VCO 11 is generated. Therefore, the oscillation gain and free run frequency of the to-be-controlled VCO 14 can always be kept constant.

Next, the voltage controlled oscillator circuit of this invention is explained more in detail.

Figure 4:
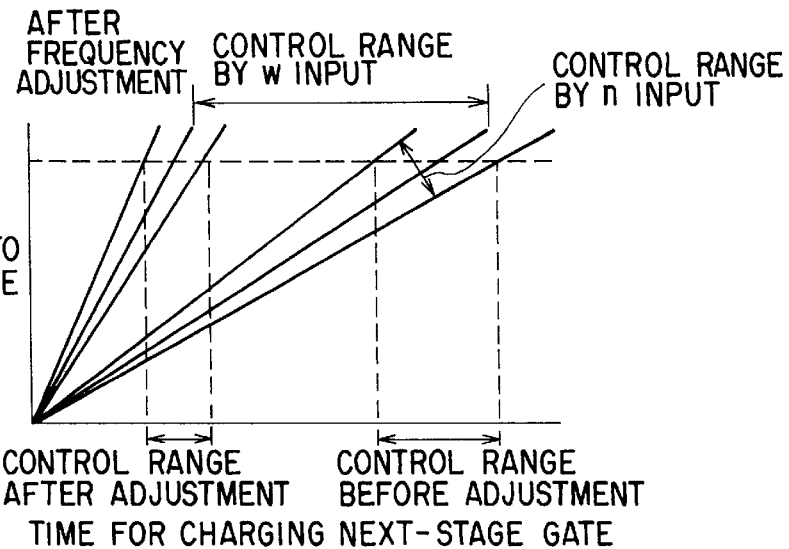
FIG. 4 is a diagram for illustrating the operation of the oscillator circuit of FIG. 3.

FIG. 4 shows the relation between the charging voltage and time for charging/discharging the next stage gate by a present stage delay circuit used in the reference VCO 11 of the oscillation gain control circuit.

Figure 5:
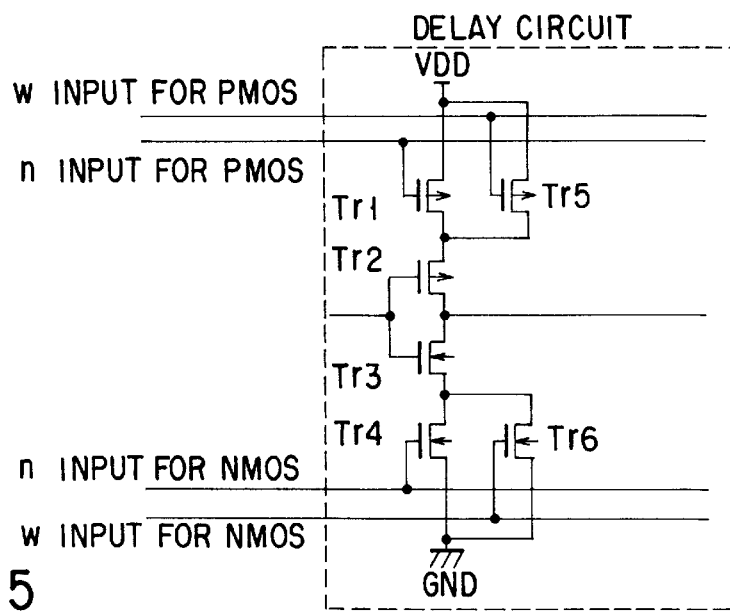
FIG. 5 is a diagram showing a delay circuit of the voltage controlled oscillator circuit of this invention.

The delay time for each stage of delay circuit is controlled by currents flowing in the transistors Tr1, Tr4, Tr5, Tr6 in the delay circuit of FIG. 5, for example. If the charging time for the gate of the next stage delay circuit becomes longer due to the process fluctuation or a variation in the temperature or power supply voltage, the oscillation frequency is lowered, but at this time, a control voltage to the input terminal of the large control coefficient becomes higher and the control operation is effected to raise the oscillation frequency in the oscillation gain control circuit.

Further, in a case where the oscillation frequency of the voltage controlled oscillator circuit is not controlled by use of a control voltage obtained by adding an input voltage input to the input terminal n of the small control coefficient to the result of multiplication of the input voltage input to the input terminal n of the small control coefficient by the input voltage input to the input terminal w of the large control coefficient, but is simply controlled by use of an input voltage input to the input terminal n of the small control coefficient, the variable range of the delay time is made narrow even if the oscillation frequency is raised by use of the input voltage to the input terminal of the large control coefficient since the control range (corresponding to a deflection angle in FIG. 4) by the input voltage to the input terminal of the small control coefficient is constant. This substantially means that the variable range of the oscillation frequency is made narrow. On the other hand, if the time for charging the gate of the next stage delay circuit becomes shorter, the oscillation frequency becomes higher and the variable range of the delay time becomes wide, and as a result, the variable range of the oscillation frequency is made wide.

Figure 6:
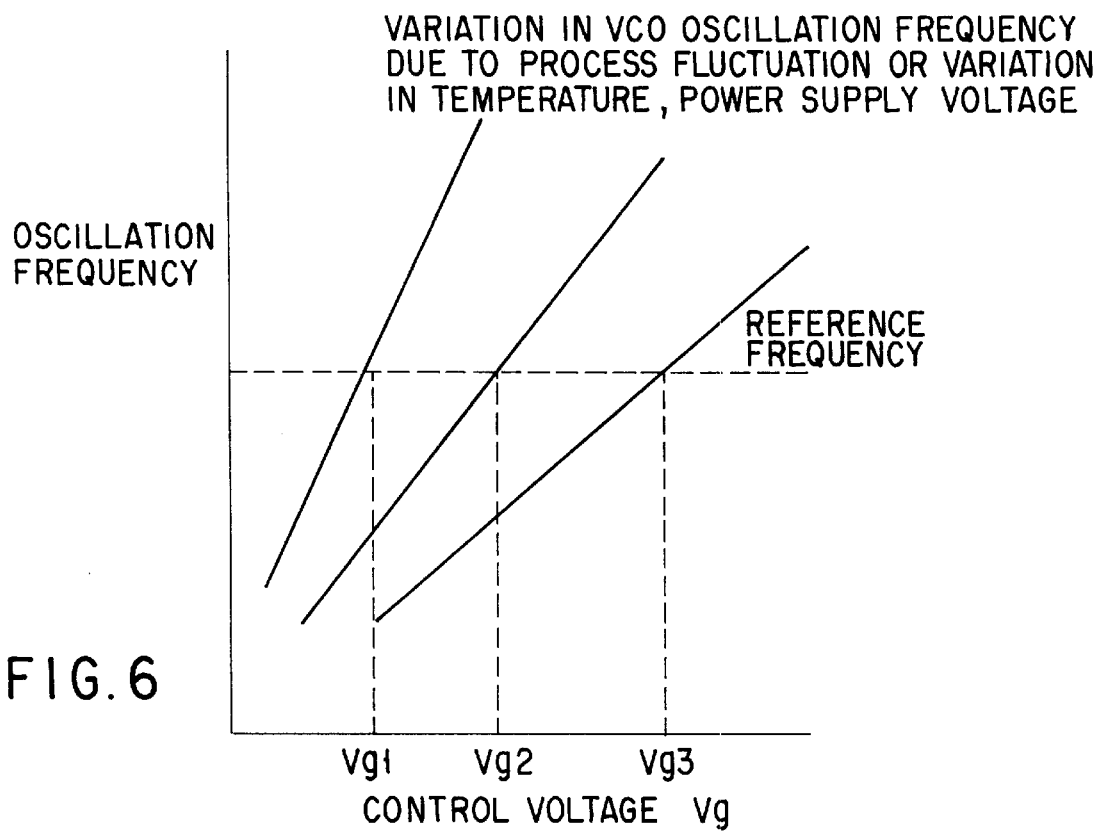
FIG. 6 is a diagram showing the oscillation characteristic of the voltage controlled oscillator circuit of this invention.

FIG. 6 shows the oscillation frequency of the reference VCO with respect to the input voltage to the input terminal of the large control coefficient while the input voltage to the input terminal of the small control coefficient is kept constant.

If the oscillation frequency of the reference VCO is lowered due to the process fluctuation or a variation in the temperature or power supply voltage, the oscillation gain control circuit effects the control operation by raising the control voltage Vg to set the output frequency Fout equal to the frequency of the reference signal. Further, if the oscillation frequency of the reference VCO is raised due to the process fluctuation or a variation in the temperature or power supply voltage, the oscillation gain control circuit effects the control operation by lowering the control voltage Vg to set the output frequency Fout equal to the frequency of the reference signal.

Figure 7:
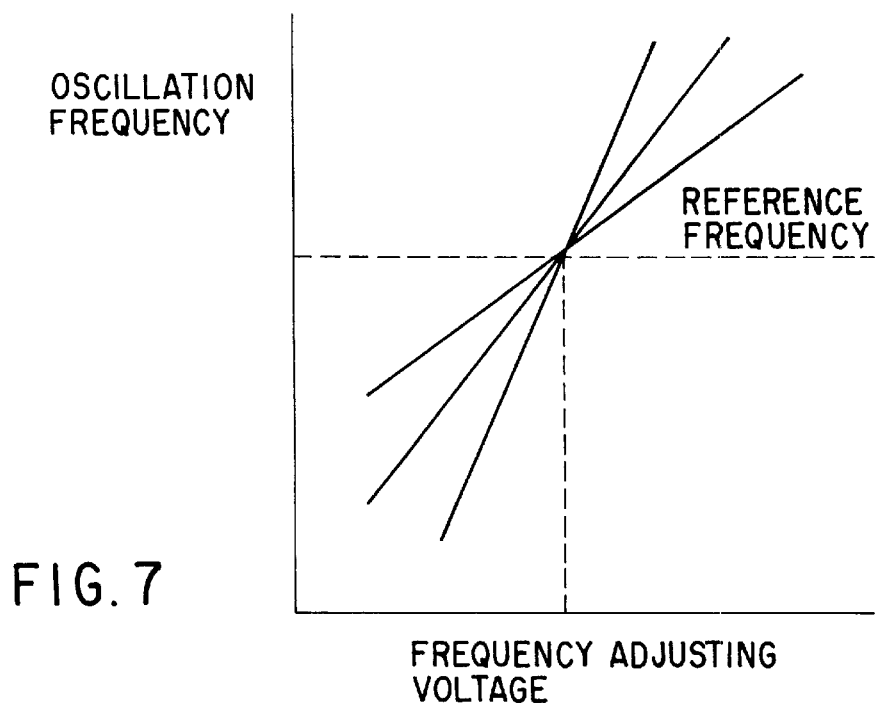
FIG. 7 is a diagram showing the oscillation characteristic of the voltage controlled oscillator circuit of this invention.

Therefore, as shown in FIG. 7, the oscillation frequency of the reference VCO is set equal to the frequency of the reference signal when the input voltage to the input terminal of the small control coefficient coincides with the reference voltage V1, but the oscillation gain of the reference VCO is significantly changed due to the process fluctuation or a variation in the temperature or power supply voltage.

Therefore, the oscillation gain can be made nearly constant by increasing a variation amount of the input voltage to the input terminal of the small control coefficient with an increase in the control voltage vg when the oscillation frequency of the reference VCO is lowered and the control voltage Vg is raised. on the other hand, the oscillation gain can be made nearly constant by reducing a variation amount of the input voltage to the input terminal of the small control coefficient with a lowering in the control voltage Vg when the oscillation frequency of the reference VCO is raised and the control voltage Vg is lowered.

Figure 8:
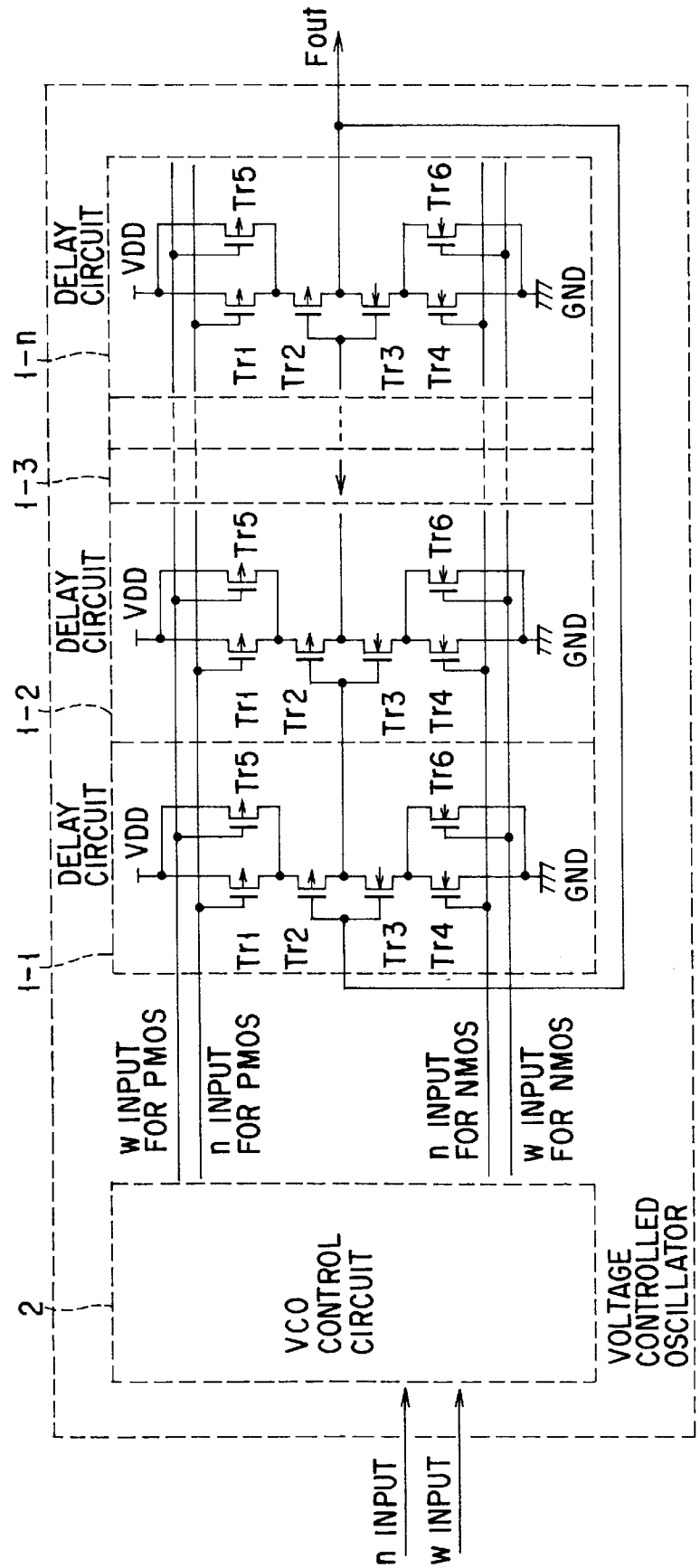
FIG. 8 is a diagram showing the construction of the voltage controlled oscillator circuit of this invention.

FIG. 8 shows the construction of the voltage controlled oscillator circuit according to this invention.

The voltage controlled oscillator circuit includes a plurality (odd number) of delay circuits 1-1, 1-2, 1-3, ..., 1-n each constructed by transistors Tr1 to Tr6, the plurality of delay circuits 1-1, 1-2, 1-3, ..., 1-n are serially connected, and the output of the final stage delay circuit 1-n is fed back as an input to the first stage delay circuit 1-1, thus constructing a ring oscillator.

At this time, if the delay time of the delay circuit of one stage is t and the number of stages is n, then the oscillation frequency f can be expressed as follows.

$$f=1/(2 \times t \times n)$$

The delay time of the delay circuit is determined by PMOS w input, PMOS n input, NMOS w input and NMOS n input. The n input voltage and w input voltage are converted into the PMOS w input, PMOS n input, NMOS w input and NMOS n input by the VCO control circuit 2 so that the amounts of currents flowing in the transistors Tr1, Tr4, Tr5, Tr6 can be changed and time required for an inverter constructed by the transistors Tr2, Tr3 to charge or discharge the input capacitor of the inverter of the next stage delay circuit can be changed.

At this time, if the conductances of the transistors Tr5, Tr6 are set to a large value, the delay time can be largely changed by the PMOS w input and NMOS w input. On the other hand, if the conductances of the transistors Tr1, Tr4 are set to a small value, the delay time can be finely changed by the PMOS n input and NMOS n input.

Therefore, the oscillation frequency of the voltage controlled oscillator circuit can be largely changed by the PMOS w input and NMOS w input and can be finely changed by the PMOS n input and NMOS n input.

Figure 9:
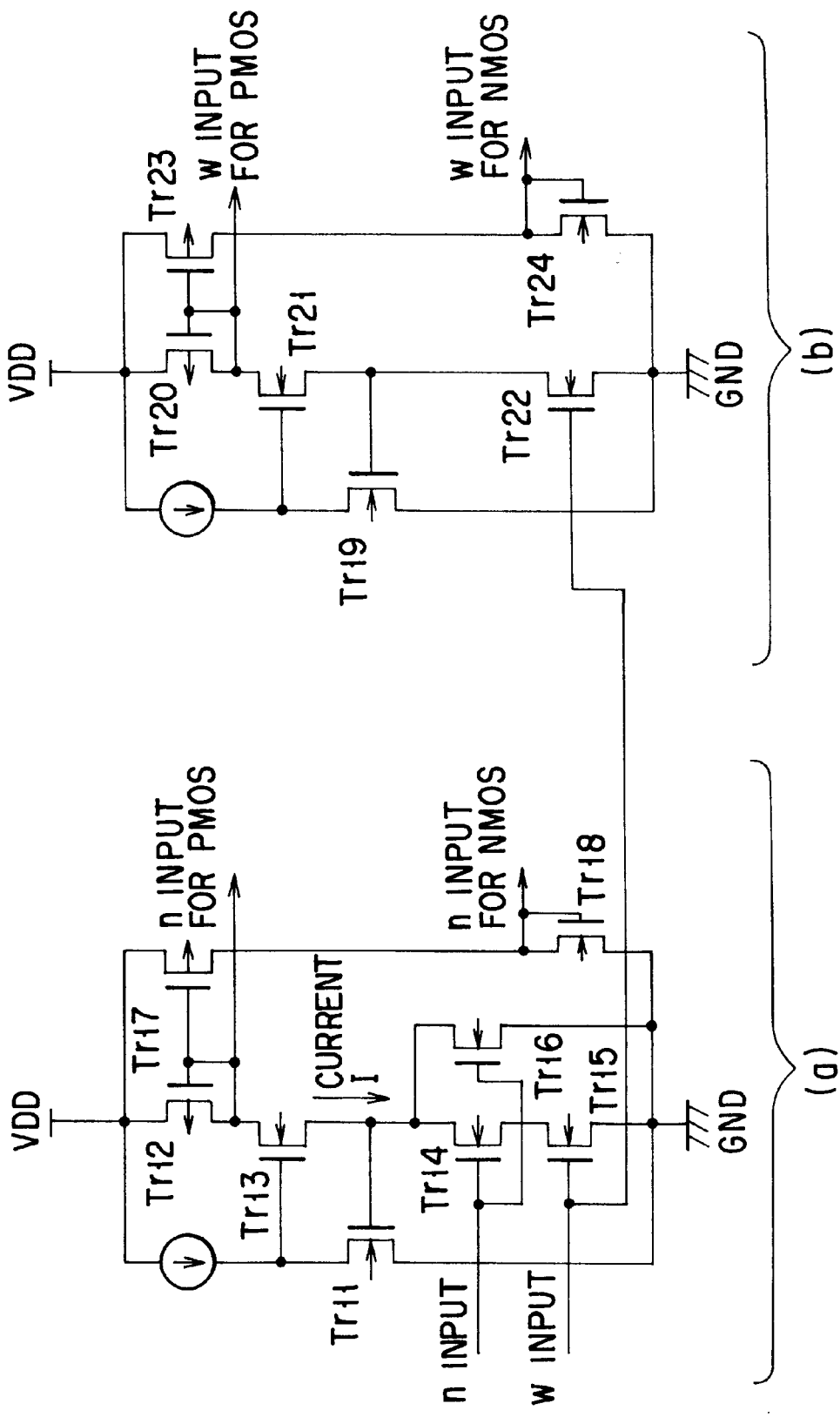
FIG. 9 is a diagram showing a first example of a VCO control circuit of FIG. 8.

FIG. 9 shows a first example of the VCO control circuit of FIG. 8.

Transistors Tr11, Tr13 are subjected to the feedback control and the transistor Tr11 controls the gate voltage of the transistor Tr13 so as to keep substantially constant the gate voltage of the transistor Tr11 which is connected to the source of the transistor Tr13. As a result, the transistors Tr11, Tr13 are always operated in the non-saturated region of the VDS (drain-source voltage)-ID (drain current) characteristic and a variation in the drain current becomes linear.

The multiplication of the gain control input w by the frequency adjusting input n is effected by serially connecting the transistors Tr12, Tr13 and adjusting the gate-source voltage of the transistor Tr14 by making variable the ON-resistance of the transistor Tr15 according to the gain control input w. The multiplication of the w input by the n input is realized by the current flowing in the transistors Tr14, Tr15, and the addition of the n input is realized by adding the current flowing in the transistor Tr16.

The added current I is made linear by the control of the transistors Tr11, Tr13. The current I is subjected to the current-voltage conversion by the transistors Tr12, Tr18 and the PMOS n input and NMOS n input can be attained.

The conversion coefficient of this circuit can be set by changing the channel lengths or channel widths of the transistors.

Further, the transistors Tr19 and Tr21 are feedback controlled and, in order to make, at all times substantially constant, the gate voltage of the MOS transistor Tr19 connected to the source of the MOS transistor Tr21, the transistor Tr19 controls the gate voltage of the transistor Tr21. As a result, the transistors Tr19 and Tr21 always operate at a non-saturation region of VDS (drain/source voltage)-ID(drain current) characteristic and the change of the drain current becomes linear in operation. The current flowing through the transistor Tr22 connected to the gain adjusting input W becomes linear in operation under the control of the transistors Tr19, Tr21. This current is current/voltage converted by the transistors Tr20, Tr24 to obtain a W input for PMOS and a W input for NMOS. This conversion coefficient can be set by varying the channel length and channel width of the transistor.

Figure 10:
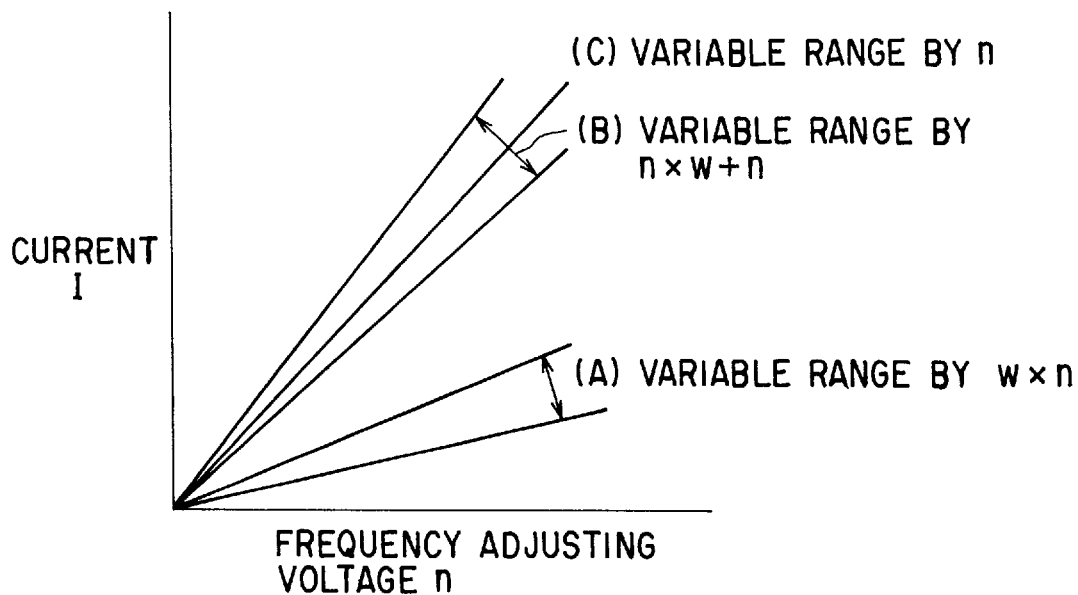
FIG. 10 is a diagram for illustrating the operation of the VCO control circuit of FIG. 9.

FIG. 10 shows the conversion characteristic of the VCO control circuit of FIG. 9 side (a).

The result of multiplication of the current flowing in the transistor Tr15 whose gate is supplied with the gain control input w by the current flowing in the transistor Tr14 whose gate is supplied with the frequency control input n is set in a variable range as indicated by (A) with respect to a variation in the voltage Vg caused by the process fluctuation or a variation in the temperature or power supply voltage. The variable range can be freely set by changing the channel lengths or channel widths of the transistors Tr14, Tr15. By adding the result of multiplication of the currents to the current (C) flowing in the transistor Tr16 whose gate is supplied with the frequency control input n, the conversion characteristic as indicated by (B) in FIG. 10 can be obtained. The PMOS n input voltage and NMOS n input voltage can be obtained by subjecting the current I to the current-voltage conversion.

Figure 11:
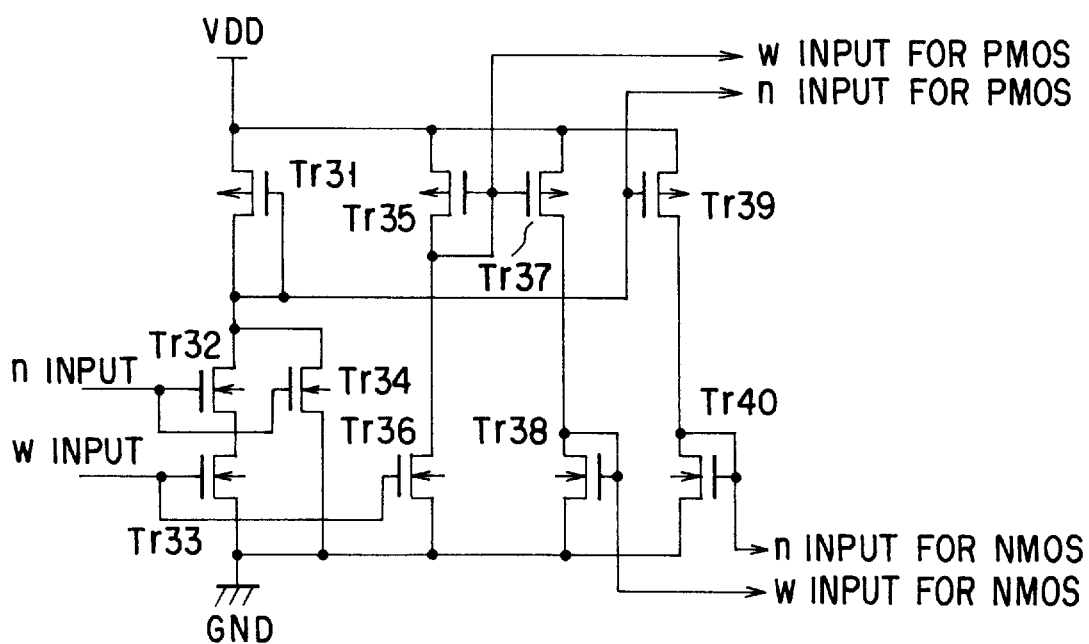
FIG. 11 is a diagram showing a second example of the VCO control circuit of FIG. 8.

FIG. 11 shows a second example of the VCO control circuit of FIG. 8.

The construction of the VCO control circuit is simplified in comparison with the construction of the VCO control circuit of FIG. 9. That is, in the circuit of FIG. 11, the number of transistors is smaller than in the circuit of FIG. 9 and the circuit scale can be made small.

Transistors Tr31, Tr32, Tr33 are serially connected between the power supply VDD and the ground node GND, and a transistor T34 is connected between the connection node of the transistors Tr31 and Tr32 and the ground node GND. The gates of the transistors Tr32, Tr34 are used as an n input terminal and the gates of the transistors Tr33, Tr36 are used as a w input terminal.

The transistors Tr35, Tr36 are serially connected between the power supply VDD and the ground node GND, transistors Tr37, Tr38 are serially connected between the power supply VDD and the ground node GND, and transistors Tr39, Tr40 are serially connected between the power supply VDD and the ground node GND. The gates of the transistors Tr35, Tr37 are connected to each other and used as the PMOS w input. Further, the gates of the transistors Tr31, Tr39 are connected to each other and used as the PMOS n input. The gate of the transistor Tr38 is used as the NMOS w input and the gate of the transistor Tr40 is used as the NMOS n input.

Figure 12:
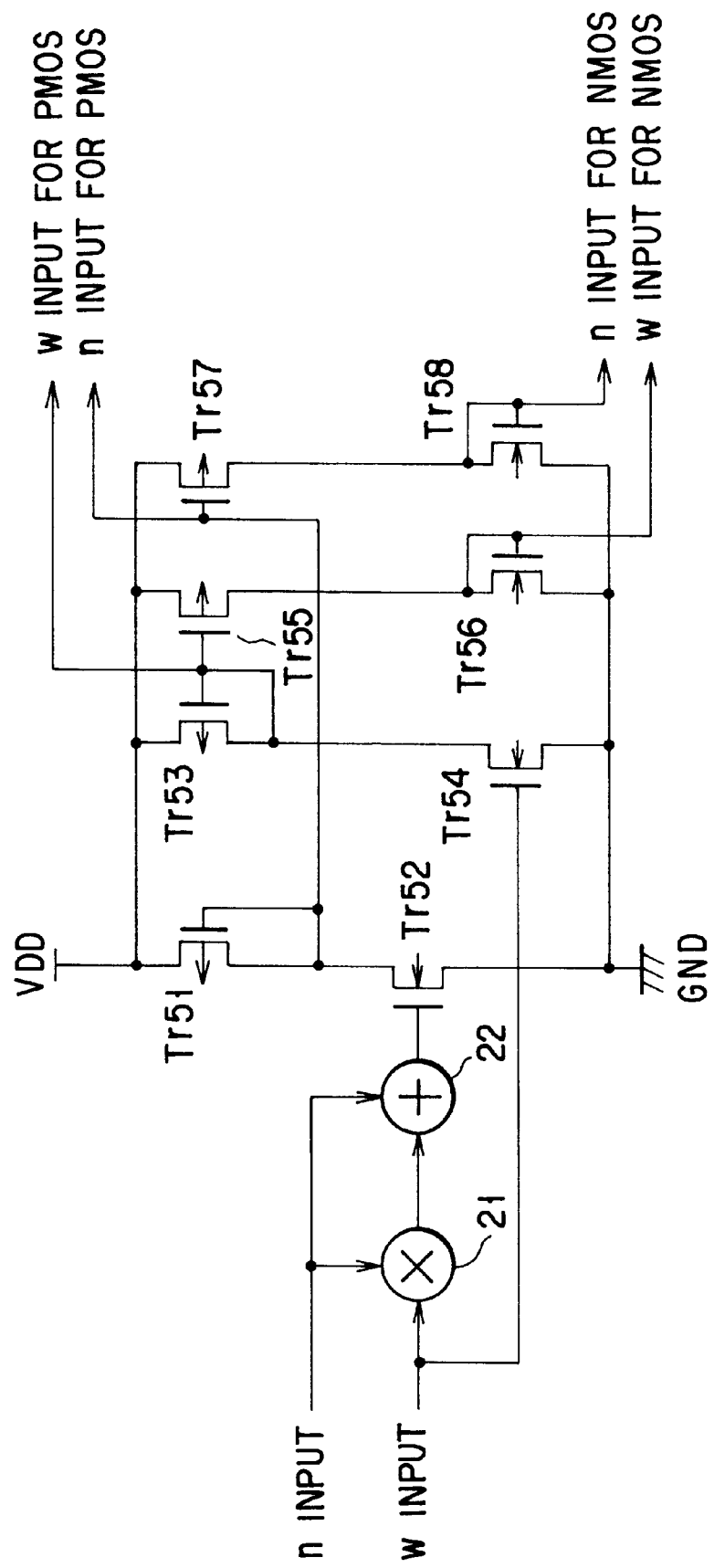
FIG. 12 is a diagram showing a third example of the VCO control circuit of FIG. 8.

FIG. 12 shows a third example of the VCO control circuit of FIG. 8.

The construction of the VCO control circuit is simplified in comparison with the construction of the VCO control circuit of FIG. 9. In the circuit of FIG. 12, the voltage values of n input and w input are multiplied and added by use of an analog operating circuit or digital operating circuit and the result of the operations is converted into a voltage value again and input to a transistor Tr52.

Further, transistors Tr51, Tr52 are serially connected between the power supply VDD and the ground node GND, and likewise, transistors Tr53, Tr54; transistors Tr55, Tr56; and transistors Tr57, Tr58 are also serially connected between the power supply VDD and the ground node GND. The gate of the transistor Tr54 is used as the w input terminal. The gates of the transistors Tr53, Tr55 are connected to each other and used as the PMOS w input. Further, the gates of the transistors Tr51, Tr57 are connected to each other and used as the PMOS n input. The gate of the transistor Tr56 is used as the NMOS w input, and the gate of the transistor Tr58 is used as the NMOS n input.

Figure 13:
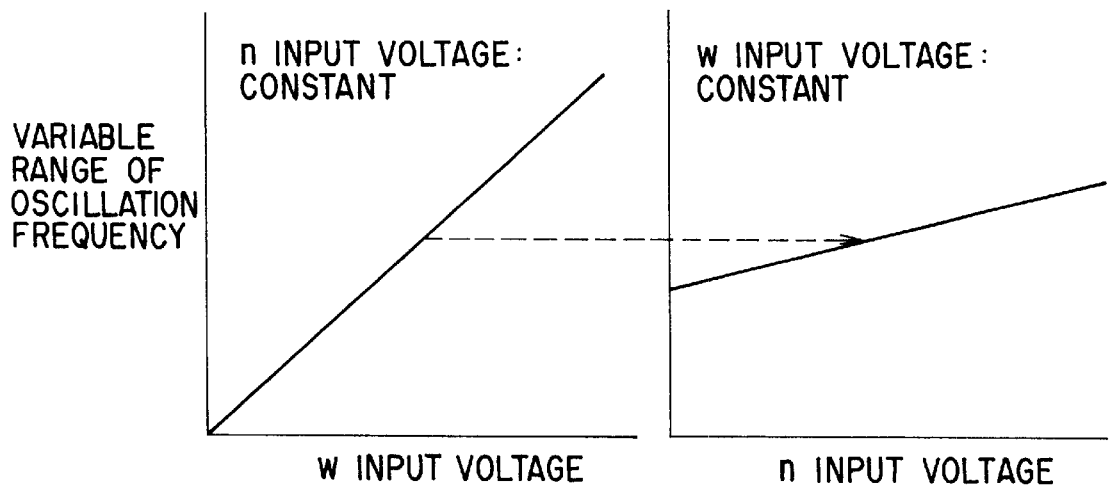
FIG. 13 is a diagram showing the oscillation frequency characteristic of the voltage controlled oscillator circuit of this invention.

FIG. 13 shows the output frequency characteristic of the voltage controlled oscillator circuit of this invention.

As is clearly seen from FIG. 13, if the input to the input terminal of the large control coefficient is changed while the input to the input terminal of the small control coefficient is kept constant, the oscillation frequency of the voltage controlled oscillator circuit (VCO) can be changed in a wide range, and if the input to the input terminal of the small control coefficient is changed while the input to the input terminal of the large control coefficient is kept constant, the oscillation frequency of the voltage controlled oscillator circuit can be changed in a narrow range.

Figure 14:
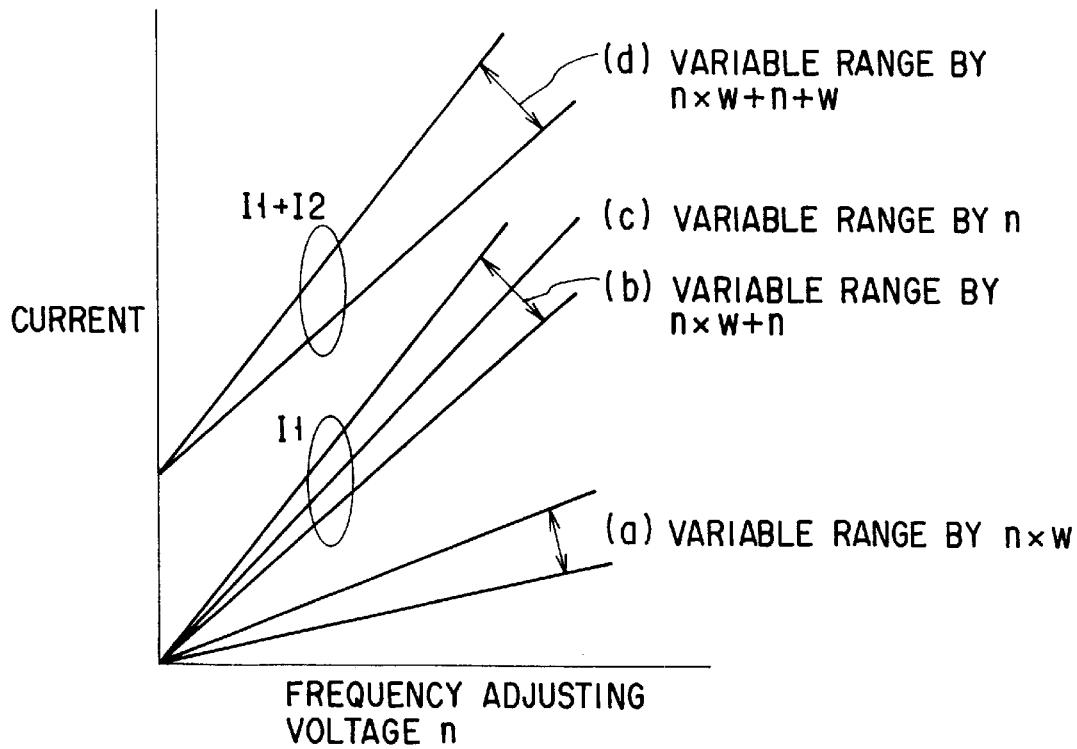
FIG. 14 is a diagram showing the oscillation frequency characteristic of the voltage controlled oscillator circuit of this invention.

FIG. 14 shows the characteristic of the voltage-current conversion circuit in the to-be-controlled VCO. The oscillation frequency of the to-be-controlled VCO is approximately proportional to a current obtained by the voltage-current conversion circuit. The variable range of a current obtained by multiplying the frequency adjusting voltage n by the gain control voltage w is indicated by (a). The characteristic (b) can be obtained by adding a current obtained by use of the frequency adjusting voltage n to the variable range. If the oscillation gain of the reference VCO in the oscillation gain control circuit is small, the voltage Vg obtained in the oscillation gain control circuit is set to a high voltage level and the PLL is locked. Therefore, the voltage Vg obtained in the oscillation gain control circuit shows the state of the oscillation gain of the reference VCO. Since the voltage Vg obtained in the oscillation gain control circuit is used as the gain control voltage w, the inclination of the voltage-current conversion characteristic is made steep to raise the oscillation gain of the to-be-controlled VCO when the oscillation gain of the to-be-controlled VCO is small.

Since the same voltage is applied to the reference VCO and the to-be-controlled VCO if the frequency adjusting voltage n coincides with the reference voltage V1 of the oscillation gain control circuit, the reference signal supplied to the oscillation gain control circuit and the output of the to-be-controlled VCO have the same frequency. Further finally, when the frequency control voltage n nearly coincides with the reference voltage V1 of the oscillation gain control circuit, a variation in the oscillation gain can be reduced near the coincidence point. Further, the characteristic as indicated by (d) can be obtained by adding a current obtained by use of the gain control voltage w to the variable range (b).

As described above, according to the voltage controlled oscillator circuit of this invention, the oscillation gain can be kept nearly constant irrespective of the process fluctuation or a variation in the temperature or power supply voltage. As a result, the oscillation gain of the voltage controlled oscillator circuit can be set to a least sufficient range obtained by removing the margin of the oscillation frequency. Further, in the conventional voltage controlled oscillator circuit, the channel lengths or channel widths of transistors constructing an inverter of each delay circuit are changed to attain coincidence of the frequencies, but in the voltage controlled oscillator circuit of this invention, the coincidence of frequencies can be attained by adjusting the control circuit and the adjusting operation can be made easy.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A voltage controlled oscillator circuit comprising:
 a control circuit for receiving first and second control signals, multiplying the first control signal by the second control signal, adding the result of multiplication to the first control signal and outputting the result of addition as a plurality of third control signals; and a generation circuit for generating a signal having an oscillation frequency based on the plurality of third control signals output from said control circuit.

2. A voltage controlled oscillator circuit according to claim 1, wherein the first control signal is input to an input terminal which has a small control coefficient to the frequency of the signal generated from said generation circuit and the second control signal is input to an another input terminal which has a great control coefficient to the frequency of the signal generated from said generation circuit.

3. A voltage controlled oscillator circuit according to claim 1, wherein the first control signal controls the output frequency of the voltage controlled oscillator circuit to a desired value, and the second control signal is an output signal of an oscillation gain control circuit and controls the gain characteristic of the output frequency of the voltage controlled oscillator circuit.

4. A voltage controlled oscillator circuit according to claim 3, wherein the oscillation gain control circuit includes a PLL circuit having a reference voltage controlled oscillator circuit which has the same oscillation characteristic as that of the above voltage controlled oscillator circuit and a control signal for controlling the reference voltage controlled oscillator circuit of said PLL circuit is output as the second control signal.

5. A voltage controlled oscillator circuit according to claim 1, wherein said generation circuit includes a ring oscillator having delay circuits of an odd number of stages.

6. A voltage controlled oscillator circuit according to claim 1, wherein said control circuit includes a first MOS transistor having a source connected to a first power supply, second and third MOS transistors serially connected between a drain of said first MOS transistor and the first power supply, a fourth MOS transistor having a source connected to a second power supply and a gate and drain connected to each other, a fifth MOS transistor having a source connected to the second power supply and a gate connected to the gate of said fourth MOS transistor, and a sixth MOS transistor having a source connected to the first power supply and a gate and drain connected to a drain of said fifth MOS transistor, and the first control signal is input to gates of said first and second MOS transistors, the second control signal is input to a gate of said third MOS transistor, and the plurality of third control signals are derived from the drains of said fourth and sixth MOS transistors.

7. A voltage controlled oscillator circuit according to claim 1, wherein said control circuit includes a first MOS transistor having a source connected to a first power supply, second and third MOS transistors serially connected between a drain of said first MOS transistor and the first power supply, a fourth MOS transistor having a source connected to a second power supply and a gate and drain connected to each other, a fifth MOS transistor having a source connected to the second power supply and a gate connected to the gate of said fourth MOS transistor, a sixth MOS transistor having a source connected to the first power supply and a gate and drain connected to a drain of said fifth MOS transistor, a seventh MOS transistor connected between the drain of said first MOS transistor and the drain of said fourth MOS transistor, and an adjusting circuit for receiving a potential at a connection node of said first and seventh MOS transistors and adjusting a gate potential of said seventh MOS transistor to keep the potential of the connection node at a substantially constant value, and the first control signal is input to gates of said first and second MOS transistors, the second control signal is input to a gate of said third MOS transistor, and the plurality of third control signals are derived from the drains of said fourth and sixth MOS transistors.

8. A voltage controlled oscillator circuit according to claim 7, wherein said adjusting circuit includes an eighth MOS transistor having a source connected to the first power supply and a constant current source circuit connected between a drain of said eighth MOS transistor and the second power supply, the potential of the connection node is input to a gate of said eighth MOS transistor and the drain of said eighth MOS transistor is connected to the gate of said seventh MOS transistor.

9. A voltage controlled oscillator circuit comprising:
a first control circuit for receiving first and second control signals, deriving an addition signal by adding the first control signal to the result of multiplication of the first control signal by the second control signal, and outputting a plurality of third control signals based on the addition signal;
a second control circuit for converting the second control signal and outputting a plurality of fourth control signals based on a converted second control signal; and
a generation circuit for generating a signal having an oscillation frequency based on the plurality of third and fourth control signals output from said first and second control circuits.

10. A voltage controlled oscillator circuit according to claim 9, wherein the first control signal is input to an input terminal which has a small control coefficient to the frequency of the signal generated from said generation circuit and the second control signal is input to another input terminal which has a great control coefficient to the frequency of the signal generated from said generation circuit.

11. A voltage controlled oscillator circuit according to claim 9, wherein the first control signal controls the output frequency of the voltage controlled oscillator circuit to a desired value, and the second control signal is an output signal of an oscillation gain control circuit and controls the gain characteristic of the output frequency of the voltage controlled oscillator circuit.

12. A voltage controlled oscillator circuit according to claim 11, wherein the oscillation gain control circuit includes a PLL circuit having a reference voltage controlled oscillator circuit which has the same oscillation characteristic as that of the above voltage controlled oscillator circuit and a control signal for controlling the reference voltage controlled oscillator circuit of said PLL circuit is output as the second control signal.

13. A voltage controlled oscillator circuit according to claim 9, wherein said generation circuit includes a ring oscillator having delay circuits of an odd number of stages.

14. A voltage-controlled oscillator circuit according to claim 13, wherein the delay circuit comprises a first MOS transistor connected at its source to a first power supply, a second MOS transistor connected at its source to the first power supply and at its drain to a drain of the first MOS transistor, a third MOS transistor connected at its source to a second power supply, a fourth MOS transistor connected at its source to the second power supply and at its drain to a drain of the third MOS transistor, fifth and sixth MOS transistors series-connected between the drain of the first MOS transistor and that of the third MOS transistor, and the plurality of third control signals are input to gates of the first and third MOS transistors and the plurality of fourth control signals are input to gates of the second and fourth MOS transistors.

15. A voltage controlled oscillator circuit according to claim 9, wherein the first control circuit includes a first MOS transistor having a source connected to a first power supply, second and third MOS transistors serially connected between a drain of said first MOS transistor and the first power supply, a fourth MOS transistor having a source connected to a second power supply and a gate and drain connected to each other, a fifth MOS transistor having a source connected to the second power supply and a gate connected to the gate of said fourth MOS transistor, and a sixth MOS transistor having a source connected to the first power supply and a gate and drain connected to a drain of said fifth MOS transistor, and the first control signal is input to gates of said first and second MOS transistors, the second control signal is input to a gate of said third MOS transistor, and the plurality of third control signals are derived from the drains of said fourth and sixth MOS transistors.

16. A voltage controlled oscillator circuit according to claim 9, wherein the first control circuit includes a first MOS transistor having a source connected to a first power supply, second and third MOS transistors serially connected between a drain of said first MOS transistor and the first power supply, a fourth MOS transistor having a source connected to a second power supply and a gate and drain connected to each other, a fifth MOS transistor having a source connected to the second power supply and a gate connected to the gate of said fourth MOS transistor, a sixth MOS transistor having a source connected to the first power supply and a gate and drain connected to a drain of said fifth MOS transistor, a seventh MOS transistor connected between the drain of said first MOS transistor and the drain of said fourth MOS transistor, and a first adjusting circuit for receiving a potential at a connection node of said first and seventh MOS transistors and adjusting a gate potential of said seventh MOS transistor to keep the potential of the connection node at a substantially constant value, and the first control signal is input to gates of said first and second MOS transistors, the second control signal is input to a gate of said third MOS transistor, and the plurality of third control signals are derived from the drains of said fourth and sixth MOS transistors.

17. A voltage controlled oscillator circuit according to claim 16, wherein said first adjusting circuit includes an eighth MOS transistor having a source connected to the first power supply and a constant current source circuit connected between a drain of said eighth MOS transistor and the second power supply, the potential of the connection node is input to a gate of said eighth MOS transistor and the drain of said eighth MOS transistor is connected to the gate of said seventh MOS transistor.

18. A voltage controlled oscillator circuit according to claim 17, wherein said second control circuit includes a ninth MOS transistor having a source connected to the first power supply, a tenth MOS transistor having a source connected to the second power supply and a gate and drain connected to each other, an eleventh MOS transistor having a source connected to the second power supply and a gate connected to the gate of said tenth MOS transistor, a twelfth MOS transistor having a source connected to the first power supply and a gate and drain connected to a drain of said eleventh MOS transistor, a thirteenth MOS transistor connected between drains of said ninth and tenth MOS transistors, and a second adjusting circuit for receiving a potential of a connection node of said ninth and thirteenth MOS transistors and adjusting a gate potential of said thirteenth MOS transistor to keep the potential of the connection node at a substantially constant level, and the second control signal is input to a gate of said ninth MOS transistor and a plurality of fourth control signals are derived from the drains of said tenth and twelfth MOS transistors.

19. A voltage controlled oscillator circuit according to claim 18, wherein said second adjusting circuit includes a fourteenth MOS transistor having a source connected to the first power supply and a constant current source circuit connected between a drain of said fourteenth MOS transistor and the second power supply, the potential of the connection node is input to a gate of said fourteenth MOS transistor and the drain of said fourteenth MOS transistor is connected to the gate of said thirteenth MOS transistor.

20. A voltage controlled oscillator circuit according to claim 9, wherein the first control circuit comprises a first MOS transistor having a source connected to a first power supply, second and third MOS transistors serially connected between a drain of the first MOS transistor and the first power supply, a fourth MOS transistor having a source connected to the second power supply and a gate and drain connected to the drain of the first MOS transistor, a fifth MOS transistor having a source connected to the second power supply and a gate connected to the drain of the fourth MOS transistor, and a sixth MOS transistor having a source connected to the first power supply and a gate and drain connected to a drain of the fifth MOS transistor, and the second control circuit comprises a seventh MOS transistor having a source connected to the first power supply, an eighth MOS transistor having a source connected to the second power supply and a gate and drain connected to a drain of the seventh MOS transistor, a ninth MOS transistor having a source connected to the second power supply and a gate connected to the gate of the eighth MOS transistor, and a tenth MOS transistor having a source connected to the first power supply and a gate and drain connected to a drain of the ninth MOS transistor, and the first control signal is input to gates of the first and second MOS transistors, the second control signal is input to gates of the third and seventh MOS transistors, the plurality of third control signals are obtained from the drains of the first and sixth MOS transistors and the plurality of fourth control signals are obtained from the drains of the eighth and tenth MOS transistors.

* * * * *